(12) United States Patent
Gillotti (10) Patent No.: US 9,455,544 B2
(45) Date of Patent: *Sep. 27, 2016

(54) WIRE LOOPS, METHODS OF FORMING WIRE LOOPS, AND RELATED PROCESSES

(75) Inventor: Gary S. Gillotti, North Wales, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 914 days.

This patent is subject to a terminal disclaimer.

(21) Appl. No.: 13/812,999

(22) PCT Filed: Aug. 3, 2011

(86) PCT No.: PCT/US2011/046420
§ 371 (c)(1),
(2), (4) Date: Jan. 29, 2013

(87) PCT Pub. No.: WO2012/021349
PCT Pub. Date: Feb. 16, 2012

(65) Prior Publication Data
US 2013/0125390 A1 May 23, 2013

Related U.S. Application Data

(60) Provisional application No. 61/372,430, filed on Aug. 10, 2010.

(51) Int. Cl.
*B23K 31/02* (2006.01)
*H01R 43/00* (2006.01)
(Continued)

(52) U.S. Cl.
CPC .............. *H01R 43/00* (2013.01); *B23K 20/005* (2013.01); *B23K 20/007* (2013.01); *H01L 24/48* (2013.01);
(Continued)

(58) Field of Classification Search
CPC . B23K 20/004; B23K 20/005; B23K 20/007
USPC ............ 228/102–103, 105, 8–11, 4.5, 180.5; 29/825
See application file for complete search history.

(56) References Cited

U.S. PATENT DOCUMENTS 5,176,310 A * 1/1993 Akiyama ............. B23K 1/0008
228/180.5
6,119,926 A * 9/2000 Egger .................. B23K 20/004
228/180.5
(Continued)

FOREIGN PATENT DOCUMENTS

CN 101252112 8/2008
JP 2005101065 A * 4/2005
(Continued)

OTHER PUBLICATIONS

International Search Report with a mailing date of Mar. 21, 2012; International Patent Application No. PCT/US2011/046420.

*Primary Examiner* — Kiley Stoner
(74) *Attorney, Agent, or Firm* — Stradley Ronon Stevens & Young, LLP (57) ABSTRACT

A method of forming a wire loop is provided. The method includes the steps of: (1) forming a conductive bump on a bonding location using a wire bonding tool; (2) bonding a portion of wire to another bonding location using the wire bonding tool; (3) extending a length of wire from the bonded portion of wire toward the bonding location; (4) lowering the bonding tool toward the bonding location while detecting a height of a tip of the wire bonding tool; and (5) interrupting the lowering of the wire bonding tool during step (4) if the wire bonding tool reaches a predetermined height.

18 Claims, 5 Drawing Sheets

(51) Int. Cl.
*B23K 20/00* (2006.01)
*H01L 23/00* (2006.01)

(52) U.S. Cl.
CPC ............... *H01L 24/85* (2013.01); *H01L 24/45* (2013.01); *H01L 24/78* (2013.01); *H01L 2224/45124* (2013.01); *H01L 2224/45144* (2013.01); *H01L 2224/45147* (2013.01); *H01L 2224/45565* (2013.01); *H01L 2224/45664* (2013.01); *H01L 2224/48095* (2013.01); *H01L 2224/48247* (2013.01); *H01L 2224/48471* (2013.01); *H01L 2224/48478* (2013.01); *H01L 2224/48479* (2013.01); *H01L 2224/48599* (2013.01); *H01L 2224/48699* (2013.01); *H01L 2224/78301* (2013.01); *H01L 2224/829* (2013.01); *H01L 2224/82045* (2013.01); *H01L 2224/85051* (2013.01); *H01L 2224/85186* (2013.01); *H01L 2224/85203* (2013.01); *H01L 2224/85205* (2013.01); *H01L 2224/85986* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01046* (2013.01); *H01L 2924/01079* (2013.01); *H01L 2924/01082* (2013.01); *Y10T 29/49117* (2015.01)

(56) References Cited

U.S. PATENT DOCUMENTS

| | | | | |
|---|---|---|---|---|
| 6,164,518 | A * | 12/2000 | Mochida | B23K 20/004 228/102 |
| 6,176,417 | B1 * | 1/2001 | Tsai | B23K 20/007 228/180.22 |
| 6,189,765 | B1 * | 2/2001 | Moon | B23K 20/007 228/10 |
| 6,244,499 | B1 * | 6/2001 | Tsai | B23K 20/007 228/180.5 |
| 6,260,753 | B1 | 7/2001 | Renard et al. | |
| 7,188,759 | B2 | 3/2007 | Calpito et al. | |
| 7,229,906 | B2 | 6/2007 | Babinetz et al. | |
| 7,815,095 | B2 | 10/2010 | Fujisawa et al. | |
| 8,152,046 | B2 | 4/2012 | Gillotti | |
| 9,314,869 | B2 * | 4/2016 | Lee | B23K 20/007 |
| 2001/0042776 | A1 * | 11/2001 | Lo | B23K 20/004 228/180.5 |
| 2004/0152292 | A1 * | 8/2004 | Babinetz | H01L 24/11 438/617 |
| 2005/0061849 | A1 * | 3/2005 | Takahashi | B23K 20/004 228/4.5 |
| 2005/0194422 | A1 * | 9/2005 | Takahashi | H01L 24/78 228/8 |
| 2006/0054665 | A1 | 3/2006 | Calpito et al. | |
| 2007/0246513 | A1 * | 10/2007 | Tei | H01L 24/85 228/101 |
| 2010/0025849 | A1 | 2/2010 | Koh et al. | |
| 2011/0180590 | A1 * | 7/2011 | Akiyama | B23K 20/007 228/111 |
| 2011/0278349 | A1 * | 11/2011 | Tei | B23K 20/007 228/111 |
| 2012/0006882 | A1 * | 1/2012 | Gillotti | B23K 3/0623 228/111 |
| 2013/0098877 | A1 * | 4/2013 | Song | B23K 20/007 219/69.11 |
| 2013/0256385 | A1 * | 10/2013 | Sugito | B23K 3/08 228/10 |
| 2013/0277414 | A1 * | 10/2013 | Brunner | H01L 24/85 228/102 |
| 2014/0131425 | A1 * | 5/2014 | Liu | B23K 3/08 228/104 |
| 2014/0138426 | A1 * | 5/2014 | Hagiwara | H01L 24/78 228/160 |
| 2014/0246480 | A1 * | 9/2014 | Gillotti | H01L 22/14 228/102 |
| 2015/0008251 | A1 * | 1/2015 | Song | B23K 3/063 228/41 |
| 2015/0200143 | A1 * | 7/2015 | Gillotti | B23K 20/004 228/104 |
| 2015/0243627 | A1 * | 8/2015 | Akiyama | H01L 24/78 228/102 |

FOREIGN PATENT DOCUMENTS

JP  2013225637 A * 10/2013
KR  20060082053  7/2006
WO  WO 2009/002345 A1 * 12/2008

* cited by examiner

WIRE LOOPS, METHODS OF FORMING WIRE LOOPS, AND RELATED PROCESSES

CROSS REFERENCE TO RELATED APPLICATION

This application claims the benefit of International Application No. PCT/US2011/046420 filed Aug. 3, 2011, which claims the benefit of U.S. Provisional Patent Application No. 61/372,430, filed Aug. 10, 2010, the content of both of which is incorporated herein by reference.

FIELD OF THE INVENTION

The present invention relates to conductive bumps and wire loops utilizing conductive bumps, and to improved methods of forming conductive bumps and wire loops.

BACKGROUND OF THE INVENTION

In the processing and packaging of semiconductor devices, conductive bumps are formed for use in providing electrical interconnections. For example, such bumps may be provided for: (1) use in flip-chip applications, (2) use as stand-off conductors, (3) wire looping applications, (4) test points for testing applications, amongst others. Such conductive bumps may be formed using various techniques. One such technique is to form the conductive bumps using wire, such as on a wire bonding machine or a stud bumping machine.

Numerous techniques for forming conductive bumps on a wire bonding machine or bumping machine are disclosed in U.S. Pat. No. 7,229,906 (entitled "METHOD AND APPARATUS FOR FORMING BUMPS FOR SEMICONDUCTOR INTERCONNECTIONS USING A WIRE BONDING MACHINE") and U.S. Pat. No. 7,188,759 (entitled "METHOD FOR FORMING CONDUCTIVE BUMPS AND WIRE LOOPS"), both of which are incorporated by reference in their entirety.

Figure 1:
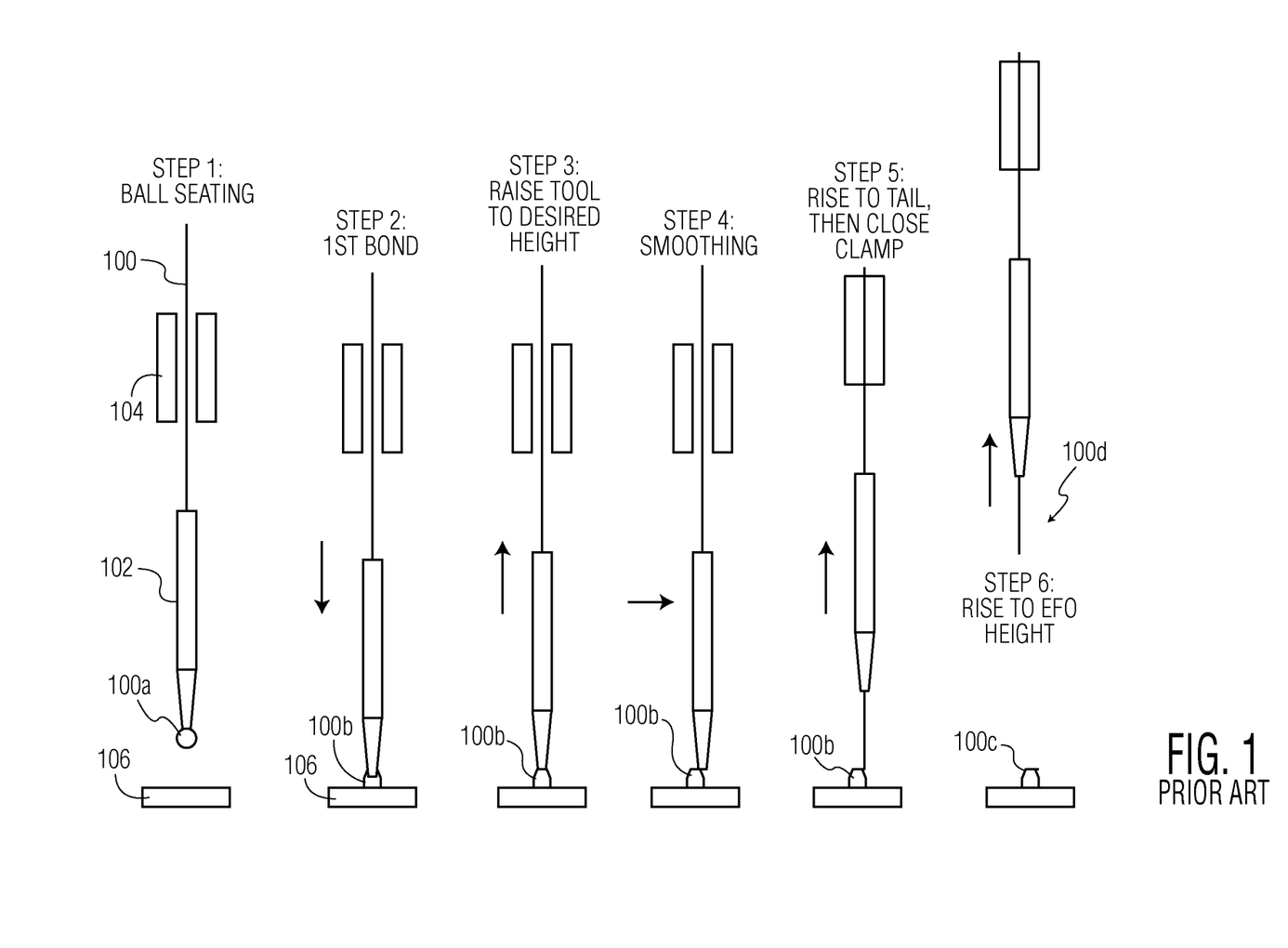
FIG. 1 is a series of diagrams illustrating a conventional approach of forming a conductive bump.

FIG. 1 illustrates an exemplary sequence of forming a conductive bump on a wire bonding machine or bumping machine. At Step 1, free air ball 100a is seated at the tip of bonding tool 102. As will be understood by those skilled in the art, prior to Step 1, free air ball 100a had been formed on an end of wire 100 that hangs below the tip of bonding tool 102 using an electronic flame-off device or the like. Wire clamp 104 is also shown at Step 1 in the open position. As will be understood by those skilled in the art, wire 100 is provided by a wire spool on the machine (not shown). Wire 100 extends from the wire spool through wire clamp 104 (and through other structures not shown) and through bonding tool 102.

After free air ball 100a is formed (prior to Step 1), wire 100 is drawn upwards (e.g., using a vacuum control tensioner or the like) such that free air ball 100a is seated at the tip of bonding tool 102 as shown at Step 1 of FIG. 1. At Step 2, bonding tool 102 (along with other elements of a bond head assembly including wire clamp 104) is lowered and free air ball 100a is bonded to bonding location 106 (e.g., a die pad of semiconductor die 106). As will be understood by those skilled in the art, the bonding of free air ball 100a to bonding location 106 may utilize ultrasonic energy, thermosonic energy, thermocompressive energy, XY table scrub, combinations thereof, amongst other techniques.

After free air ball 100a is bonded to bonding location 106 at Step 2 (where the bonded free air ball may now be termed bonded ball 100b), with wire clamp 104 still open, bonding tool 102 is raised to a desired height as shown by the upward arrow in Step 3. This height may be referred to as a separation height (as shown in Step 3 of FIG. 1, bonding tool 102 has been raised such that bonded ball 100b is no longer seated in the tip of bonding tool 102). At Step 4, with wire clamp 104 still open, bonding tool 102 is moved in at least one horizontal direction (e.g., along the X axis or Y axis of the machine) to smooth the top surface of bonded ball 100b. Such smoothing provides a desirable top surface for a conductive bump, and also weakens the connection between bonded ball 100b and the rest of the wire to assist in the separation therebetween. At Step 5, bonding tool 102 is raised to another height (which may be referred to as the wire tail height), and then wire clamp 104 is closed. Then at Step 6, bonding tool 102 is raised to break the connection between bonded ball 100b (which may now be termed conductive bump 100c) and the remainder of wire 100. For example, bonding tool 102 may be raised to an EFO height which is a position at which an electronic flame-off device forms a free air ball on wire tail 100d of wire 100.

Forming conductive bumps using such conventional techniques may result in certain deficiencies. Such deficiencies may include, for example: premature separation between bonded ball 100b and the rest of wire 100 due to the smoothing at step 4; potential short wire tail conditions because of such premature separation; potential long wire tail conditions; and undesirably reduced smoothing of bonded ball 100b in an attempt to avoid such premature separation.

Conductive bump 100c shown at Step 6 may be used as a stand-off in a wire looping process known as stand-off stitch bonding ("SSB"). Improved wire looping techniques utilizing conductive bumps, including improved SSB techniques would be desirable.

SUMMARY OF THE INVENTION

According to an exemplary embodiment of the present invention, a method of forming a wire loop is provided. The method includes the steps of: (1) forming a conductive bump on a bonding location using a wire bonding tool; (2) bonding a portion of wire to another bonding location using the wire bonding tool; (3) extending a length of wire from the bonded portion of wire toward the bonding location; (4) lowering the wire bonding tool toward the bonding location while detecting a height of a tip of the wire bonding tool; and (5) interrupting the lowering of the wire bonding tool during step (4) if the wire bonding tool reaches a predetermined height.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION OF THE INVENTION

In certain exemplary embodiments of the present invention, during formation of stand-off stitch wire loops, methods of detecting lift-off of conductive bumps (e.g., using software of the wire bonding machine) are provided. For example, the z-axis position is measured (e.g., using a z-axis encoder or the like) to determine a height at which a second bond of an SSB wire loop is to be bonded (e.g., stitch bonded) to a previously formed conductive bump. During formation of the SSB wire loops, when the wire bonding tool (e.g., capillary) is seeking the upper surface of the conductive bump (e.g., for the "stitch on bump" bonding process) a determination is made if the bump is missing (e.g., using a servo motor control signal or the like). Such a determination may be made, for example, if the wire bonding tool is lowered during the "stitch on bump" bonding process to a height (e.g., a predetermined height) below the typical height (e.g., plus a predetermined threshold). If it is determined that the bump is missing the wire bonding process may be stopped, and an alert may be provided (e.g., to an operator, to a control room, etc.).

In connection with the formation of SSB wire loops, conductive bumps are formed. In accordance with the present invention, such conductive bumps may be formed using a process as described above with respect to FIG. 1. However, the present invention may have particular applicability to SSB processes using a bump forming process such as that shown in FIG. 2. In such a process, after deposition and bonding of a free air ball to form the conductive bump, but prior to the smoothing of the upper surface, the bonding tool is raised to a desired height (e.g., a tail height) with the wire clamp open. Then the wire clamp is closed and the wire bonding tool is lowered (to a smoothing height) to perform the upper surface smoothing of the conductive bump. This process results in a slack length of wire between the top of the bonding tool and the bottom of the wire clamp. After completion of the smoothing of the upper surface of the bump, the wire bonding tool is raised to separate the remainder of the wire from the conductive bump. In this process, the slack length of wire now facilitates a desirable wire tail length, thereby substantially reducing the potential for shorts tails and associated problems. More specifically, during a "smoothing" process (see Step 6 of FIG. 2), the wire clamp remains closed which substantially reduces the potential for (or even prevents) the wire from passing through the wire bonding tool creating a stoppage in the process (which may result in a short tail error). In contrast to conventional techniques (where the wire tail is formed after the smoothing is complete), the length of the wire tail is established before the smoothing occurs (e.g., see Steps 4-7 of FIG. 2). Further, the wire tail will tend to be stronger than in conventional bump forming techniques, because no smoothing motion has occurred to weaken the wire tail, thereby reducing the potential for additional errors.

Figure 2:
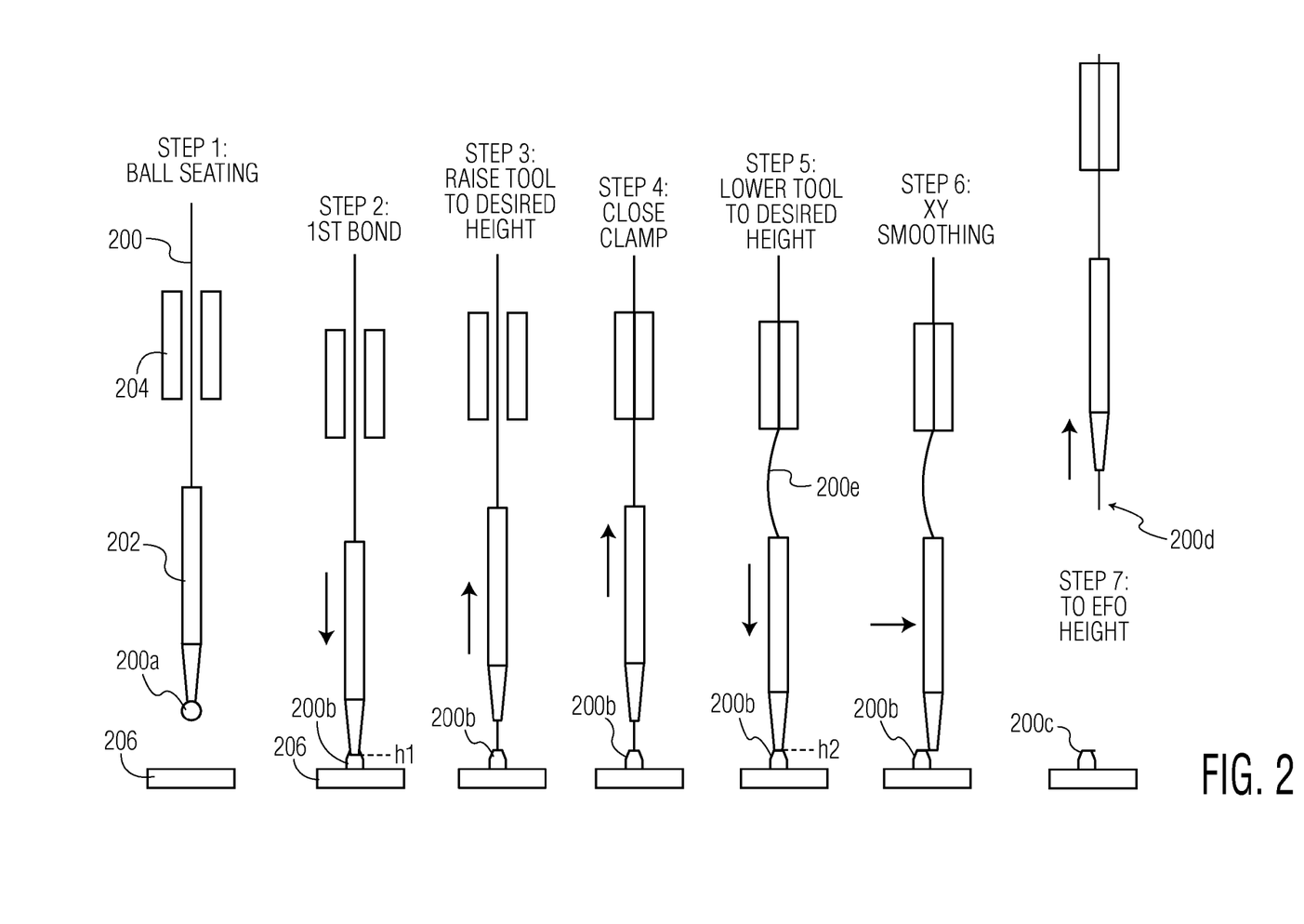
FIG. 2 is a series of diagrams illustrating a method of forming a conductive bump in accordance with an exemplary embodiment of the present invention.

FIG. 2 illustrates an exemplary sequence of forming a conductive bump on a wire bonding machine or bumping machine, where such a bump may be used in connection with the methods of the present invention. At Step 1, free air ball 200a is seated at the tip of bonding tool 202. As will be understood by those skilled in the art, prior to Step 1, free air ball 200a had been formed on an end of wire 200 that hangs below the tip of bonding tool using an electronic flame-off device or the like. Wire clamp 204 is also shown at Step 1 in the open position.

After free air ball 200a is formed (prior to Step 1), wire 200 is drawn upwards (e.g., using a vacuum control tensioner or the like) such that free air ball 200a is seated at the tip of bonding tool 202 as shown at Step 1 of FIG. 2. At Step 2, bonding tool 202 (along with other elements of a bond head assembly including wire clamp 204) is lowered (i.e., where a lower tip of tool 202 is at bonding height h1) and free air ball 200a is bonded to bonding location 206 (e.g., a die pad of semiconductor die 206). As will be understood by those skilled in the art, the bonding of free air ball 200a to bonding location 206 (to form bonded ball 200b) may utilize ultrasonic energy, thermosonic energy, thermocompressive energy, XY table scrub, combinations thereof, amongst other techniques.

After bonding of free air ball 200a at Step 2 (but before Step 3) other motions may be completed as desired. For example, a fold of wire may be formed on bonded ball 200b before Step 3 such as is described in U.S. Pat. No. 7,229,906. Of course, other motions and configurations of bonded ball 200b are contemplated.

After free air ball 200a is bonded to bonding location 206 at Step 2 (where the bonded free air ball may now be termed bonded ball 200b), with wire clamp 204 still open, bonding tool 202 is raised to a desired height at Step 3. This height may be referred to as a tail height (at this height in Step 3 of FIG. 2 the tip of wire bonding tool 202 is separated from bonded ball 200b); however, it is understood that different heights may be selected. While the invention is not limited thereto, exemplary ranges for this height (taken with respect to the tip end of the bonding tool) are between 5-20 mils and between 10-20 mils above the top of bonded free air ball 200b. At Step 4, wire clamp 204 is closed. At Step 5, bonding tool 202 is lowered to a desired height. This height may be referred to as a smoothing height h2 (at Step 5 of FIG. 2, the tool has been lowered such that the tip of bonding tool 202 is just barely in contact with an upper surface of bonded ball 200b). While the invention is not limited thereto, exemplary ranges for this height are between 0.1-2 mils and between 1-2 mils above the height of bonding tool 202 at Step 2 (i.e., above bonding height h1). At Step 5, by lowering bonding tool 202 with the wire clamp closed, a slack length of wire 200e has been provided below the bottom of wire clamp 204 and above bonding tool 202. At Step 6, with wire clamp 104 still closed, bonding tool 202 is moved in at least one horizontal direction (e.g., along the X axis, the Y axis, both the X and Y axes, another horizontal direction, etc.) to smooth the top surface of bonded ball 200b. Such smoothing provides a desirable top surface for a conductive bump, and also weakens the connection between the bonded ball and the rest of the wire to assist in the separation therebetween. At Step 7, bonding tool 202 is raised to break the connection between bonded ball 200b (which may now be termed conductive bump 200c) and the remainder of wire 200. For example, bonding tool 202 may be raised to an EFO height which is a position at which an electronic flame-off device forms a free air ball on wire tail 200d of wire 200. In connection with raising bonding tool 202 to break the connection at Step 7, ultrasonic energy or the like may also be applied to facilitate threading of slack length of wire 200e through the tip of bonding tool 202 to provide wire tail 200d.

In FIG. 2, the height of bonding tool 202 at Steps 5 and 6 is the same; however, it is understood that the height may be changed as desired from one step to the next to achieve the desired smoothing. That is, in FIG. 5 the tip of the bonding tool may be lowered to a separation height (similar to the separation height of Step 3 of FIG. 1) that is different from the smoothing height h2.

By providing the slack length of wire 200e in this process prior to tearing wire 200 to separate conductive bump 200b from the remainder of wire 200, a desirable wire tail length 200d is provided. Thus, the potential for short tails (where there is not enough wire to form the next free air ball hanging below the tip of bonding tool 202) is substantially reduced. Thus, a desirable level of horizontal smoothing can be accomplished in Step 6 of FIG. 2 without substantial risk of complications related to premature separation.

The smoothing at Step 6 of FIG. 2 may vary considerably. For example, the smoothing operation may consist of a single horizontal motion of bonding tool 202 across the top surface of bonded ball 200b as shown in Step 6 of FIG. 2. However, multiple motions (e.g., back and forth, in different directions, etc.) may be provided in the smoothing operation. Further, the smoothing motion may be completely horizontal as shown in Step 6, or may have both horizontal and vertical (e.g., upward or downward) components. Thus, the smoothed surface may be sloped in a given direction as is desired. Further still, the smoothing step of Step 6 may be combined with the lowering of bonding tool 202 of Step 5 into a single (e.g., simultaneous) motion. That is, the motion of bonding tool 202 may follow an angled path (e.g., downward and to the right as shown in FIG. 2) whereby the lowering of Step 5 and the smoothing of Step 6 are completed in a single motion.

Figure 3A:
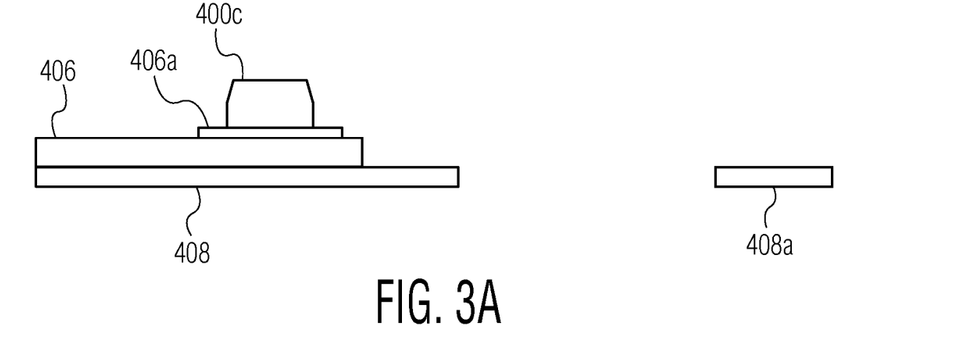
FIGS. 3A-3C is a series of diagrams illustrating a method of forming a stand-off stitch wire loop in accordance with an exemplary embodiment of the present invention.
Figure 3B:
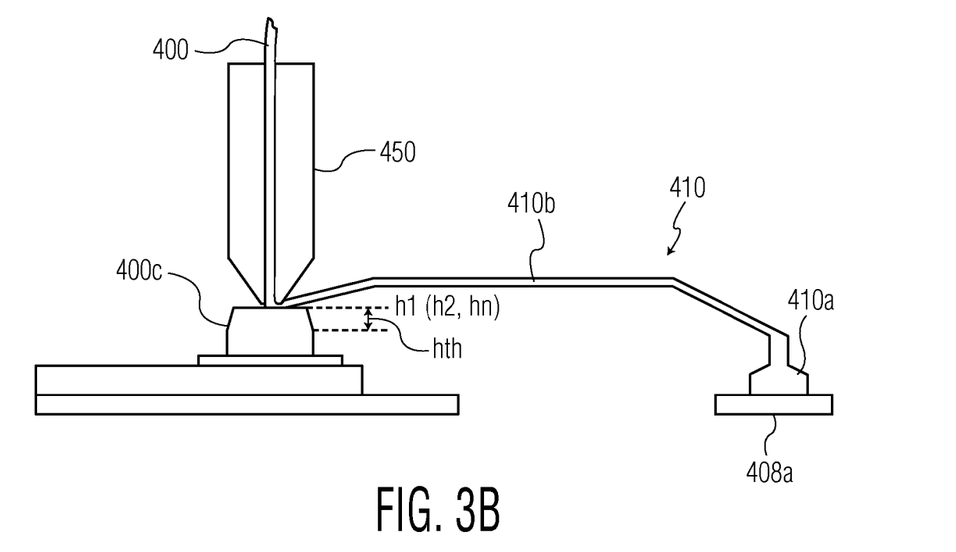
Figure 3C:
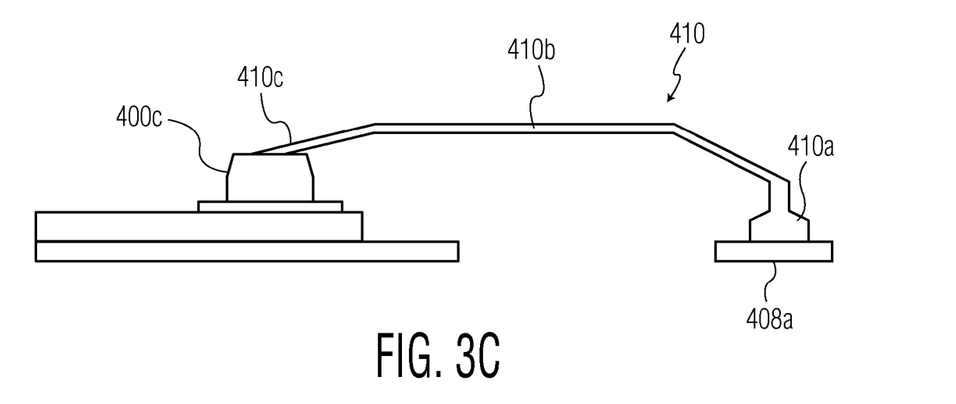

FIGS. 3A-3C illustrate a method of forming an SSB wire loop in accordance with an exemplary embodiment of the present invention. FIG. 3A illustrates conductive bump 400c which has been formed on bonding location 406a (e.g., die pad 406a of semiconductor die 406). Semiconductor die 406 is supported by substrate 408 (e.g., leadframe 408). For example, conductive bump 400c has been formed according to the method described in FIG. 2 or another method (e.g., such as the method shown in FIG. 1). During formation of conductive bump 400c (e.g., by bonding a free air ball to bonding location 406a), a height of the bonding tool is detected (and/or measured and stored into memory of the wire bonding machine). For example, the height may be height h1 shown at Step 2 of FIG. 2 (i.e., a bonding height). In another example, the height may be height h2 shown at Step 5 of FIG. 2 (i.e., a smoothing height). Other heights (e.g., other heights below the smoothing height h2 may also be selected). For purposes of the present example, let us assume that the detected height is a bonding height h1, which is detected, for example, using a z-axis encoder of the wire bonding machine (e.g., using velocity based detection, forced based detection, etc.).

After bump 400c has been formed (as shown in FIG. 3A), it is desired to now electrically connect bonding location 408a (e.g., lead finger 408a of leadframe 408) to conductive bump 400c. FIG. 3B illustrates continuous wire loop 410 providing electrical interconnection between lead finger 408a and conductive bump 400c. As is known to those skilled in the art, bonded portion 410a (e.g., first bond 410a, formed by bonding a free air ball to lead 408a) is formed on lead finger 408a. Then, length of wire 410b (continuous with first bond 410a) is extended toward conductive bump 400c. At FIG. 3B wire bonding tool 450 is bonding (e.g., ultrasonically) a second bond portion of the wire to bump 400c.

Prior to this bonding operation, according to an exemplary embodiment of the present invention, a z-axis height of the wire bonding tool tip has been detected to ensure that conductive bump 400c has not been previously lifted off bonding location 406a. That is, when forming conductive bump 400c (earlier in the process than the image shown in FIG. 3A) a height of the wire bonding tool is detected. For example, the detected height may be the bonding height h1. In such a case, in order to ensure that bump 400c has not been lifted off, the height of the tip of wire bonding tool 450 is monitored as it descends to bond the wire to bump 400c to complete the SSB wire loop. If bump 400c is present (e.g., it has not been lifted off bonding location 406a), then bonding tool 450 will make contact with bump 400c at (or about) height h1. Such contact may be detected, for example, by detecting the velocity of wire bonding tool 450 as it descends (e.g., a change in velocity measured using the z-axis position from the encoder). Another exemplary method of detecting such contact is, for example, by detecting the force against wire bonding tool 450 as it descends (e.g., using a force sensor engaged with a transducer of a bond head assembly carrying wire bonding tool 450).

If bump 400c is not present (e.g., it has been previously lifted off bonding location 406a), then wire bonding tool 450 will not make contact with bump 400c at (or about) height h1. In such as case, it may be desired to stop movement of wire bonding tool 450 (e.g., to avoid damage to the device being bonded, to avoid damage to the wire bonding tool, to avoid machine downtime, etc.). However, in order to ensure that bump 400c is not present, the tip of wire bonding tool 450 may pass a height threshold $h_{th}$ below height h1. Exemplary ranges for height $h_{th}$ are less than 10 micrometers below height h1 (or whatever height is used as the reference height such as h2, hn, etc.), less than 7 micrometers below height h1, less than 5 micrometers below height h1, and between 3-5 micrometers.

As shown in FIG. 3B, conductive bump 400c is present during the bonding of a portion of wire 400 (from a wire supply such as a wire spool, not shown) to conductive bump 400c. As such, wire bonding tool 450 has not descended below height h1 by at least threshold $h_{th}$. Thus, conductive bump 400c is not declared as missing and the bonding operation at FIG. 3B is completed. At FIG. 3C, the bonding operation is complete (i.e., wire portion 410c has been bonded to conductive bump 400c). Thus, conductive bump 400c acts as a stand-off for SSB wire loop 410.

The bonding of wire portion 410c (e.g., second bond 410c) to conductive bump 400c may be a closed loop controlled process. For example, a z-position of the bonding tool may be monitored, wherein the ultrasonic energy applied during the bonding of wire portion 410c to conductive bump 400c is turned off upon wire bonding tool 450 reaching a predetermined z-position (i.e., a position along the vertical z-axis of the wire bonding machine). More specifically, prior to the formation of second bond 410c on conductive bump 400c, wire bonding tool 450 descends toward conductive bump 400c. After impact between wire bonding tool 450 (including wire portion 410c carried by wire bonding tool 450) and conductive bump 400c at a certain z-position (i.e., the z-impact position), a reference position may be established (where the reference position may be, for example: the impact z-position; a z-position slightly above the impact position; the smoothing z-position (e.g., smoothing height h2 at Step 5 of FIG. 2); a z-position where ultrasonic energy is applied during second bond formation; a z-position at a predetermined time after impact between wire bonding tool 450 and the bump, amongst others). Then, the ultrasonic energy is applied to form second bond 410c, that is, to bond wire portion 410c to conductive bump 400c (where the ultrasonic energy may be turned on before impact, upon impact, upon the bonding tool reaching the reference position, etc.).

Then, the ultrasonic energy is turned off (or reduced, for example, by at least 50% of the energy level) (e.g., with or without a predetermined time delay) upon the bonding tool reaching the predetermined z-position such that wire bonding tool 450 does not drive too deep into conductive bump 400c. For example, the predetermined z-position may be selected relative to a reference z-position. That is, after wire bonding tool 450 reaches the selected reference position, the z-position is monitored (e.g., using a z-axis encoder or other technique) to determine when wire bonding tool 450 reaches the predetermined position. Of course, other techniques of determining the predetermined z-position (and/or the reference z-position) are contemplated within the scope of the present invention.

In the example shown in FIGS. 3A-3C, the wire bonding machine determined that the previously formed conductive bump 400c was present prior to bonding of wire portion 410c to conductive bump 400c. In contrast, in the example described below in connection with FIGS. 4A-4D, the conductive bump 400c is absent.

Figure 4A:
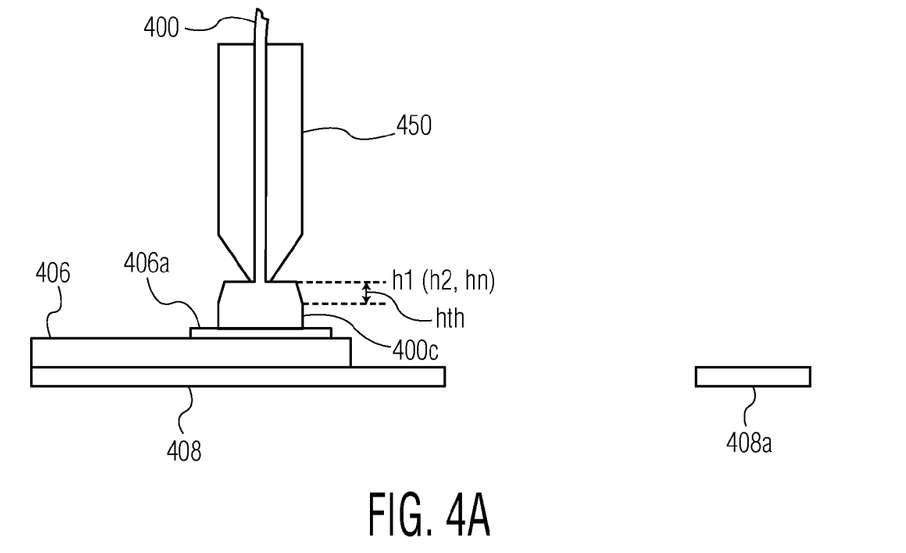
FIGS. 4A-4D is a series of diagrams illustrating an attempted method of forming a stand-off stitch wire loop, where a conductive bump has lifted-off from a bonding location, in accordance with an exemplary embodiment of the present invention.
Figure 4B:
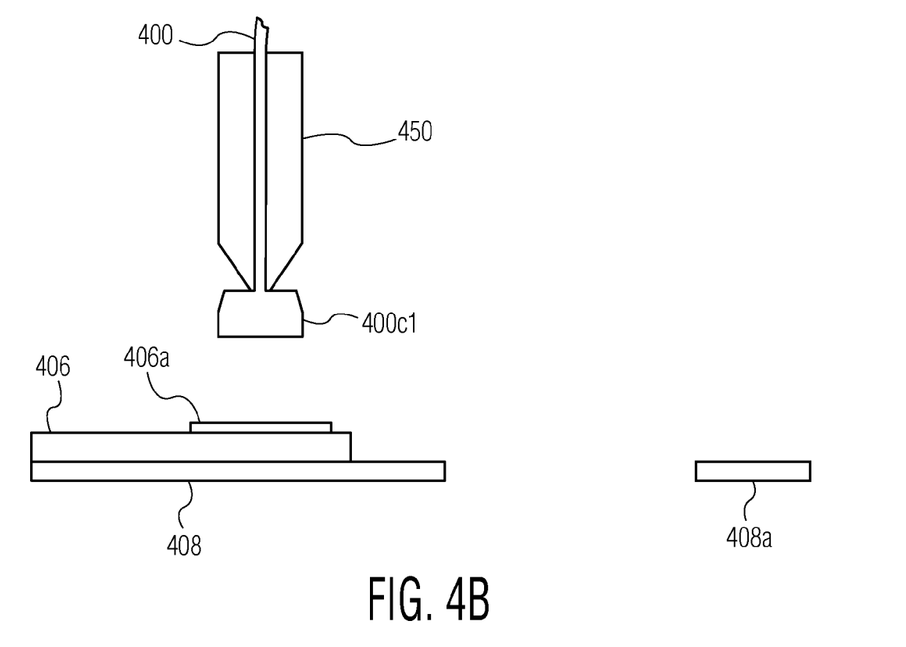

Referring specifically to FIG. 4A, conductive bump 400c is being formed on bonding location 406a (e.g., die pad 406a of semiconductor die 406). That is, a previously formed free air ball (on wire 400) is being bonded to bonding location 406a to form bump 400c. Semiconductor die 406 is supported by substrate 408 (e.g., leadframe 408). During the formation of bump 400c, a height is detected. As provided above, the height may be the bonding height h1 (e.g., bonding height h1 from Step 2 of FIG. 2), the smoothing height h2 (e.g., smoothing height h2 from Step 5 of FIG. 2), or another height hn. This height is detected (e.g., and saved into memory of the wire bonding machine). At FIG. 4B wire bonding tool 450 is raised (e.g., to form another free air ball for bonding to bonding location 408a). However, while raising wire bonding tool 450, conductive bump 400c (now labeled as 400c1 as it has been raised off of its bonding location 406a) has been lifted off bonding location 406a with bonding tool 450. For example, the lift off of conductive bump 400c may be caused by the smoothing motion (e.g., the smoothing motion of Step 6 of FIG. 2).

Figure 4C:
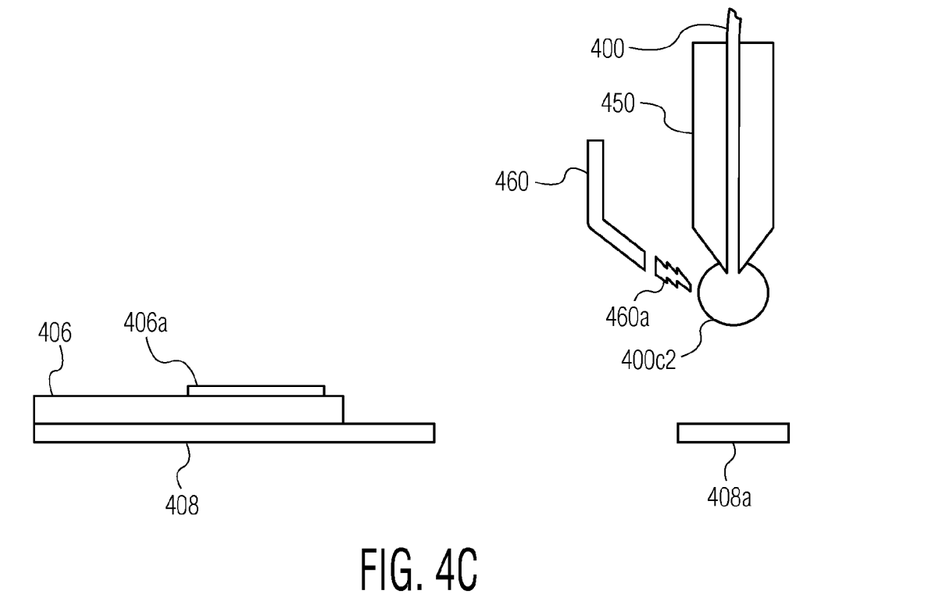
Figure 4D:
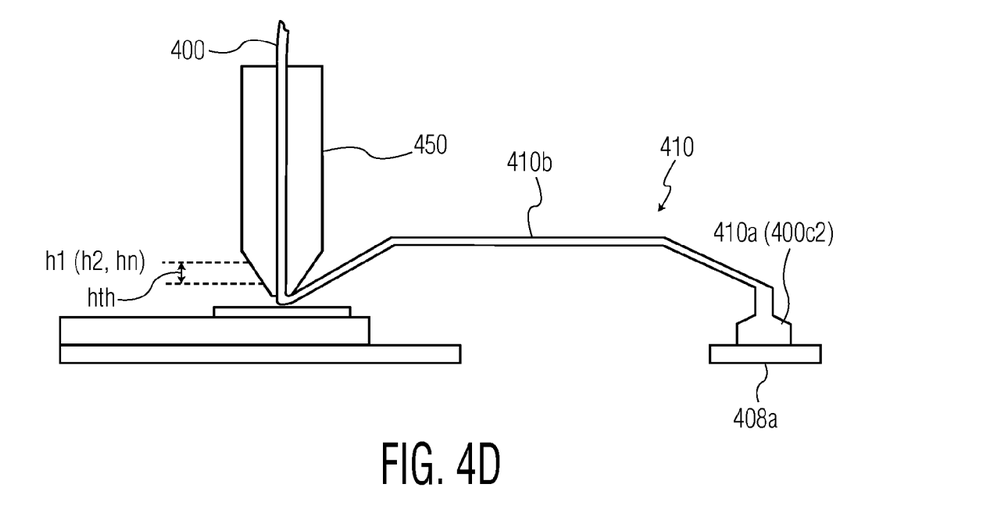

At FIG. 4C wire bonding tool 450 has raised to a flame-off height. At this height, an electronic flame-off (EFO) assembly is used to form a new free air ball on a wire tail. However, in this case, there is no exposed wire tail because of the lift-off of conductive bump 400c. Thus, during the flame-off operation, spark 460a from EFO wand 460 (of an EFO assembly, not shown) melts conductive bump 400c1 into free air ball 400c2. At FIG. 4D, free air ball 400c2 has been bonded to bonding location 408a to form first bond 410a. Then, length of wire 410b (continuous with first bond 410a) is extended toward bonding location 406a (where conductive bump 400c should be, but it is not). During the descent of wire bonding tool 450 towards bonding location 406a, a z-axis height of the tip of wire bonding tool 450 is detected to ensure that conductive bump 400c has not been previously lifted off bonding location 406a. In this example, conductive bump 400c has been lifted off of bonding location 406a (as illustrated in FIG. 4A). Thus, the wire bonding system (e.g., using software) determines that the tip of bonding tool 450 has passed height h1, and indeed has passed height h1 by more than the height threshold $h_{th}$ shown in FIG. 4D. Thus, it can be declared that conductive bump 400c is missing. The bonding process may now be stopped (including stopping descent of bonding tool 450), and an alert may be provided (e.g., to an operator, to a control room, etc.).

The inventive techniques disclosed herein are particularly applicable to copper wire bonding. Copper wire has certain physical properties that tend to exacerbate the potential for short tail errors using conventional bumping techniques. Thus, the present invention may provide exceptional benefits to copper wire bumping and bonding processes. Of course, the inventive techniques are also applicable to other types of wire bonding including, for example, gold, aluminum, and Pd coated Cu wire bonding.

Although the present invention has been described primarily with respect to certain exemplary method steps in a predetermined order, it is not limited thereto. Certain of the steps may be rearranged or omitted, or additional steps may be added, within the scope of the present invention.

Although certain exemplary embodiments of the present invention have been illustrated and described in connection with detecting a height of the tip of a wire bonding tool (e.g., the lower tip) it is not limited thereto. It will be appreciated that a height of any portion of the wire bonding tool, or a structure that moves with the bonding tool, may be detected to achieve certain benefits of the invention described herein.

Although the present invention has been illustrated and described in connection with techniques of detecting bump lift-off, it is not limited thereto. Conductive bumps (such as bump 400c illustrated herein) may have problems detected by the present invention other than lift-off. Such problems may include, for example, misplaced bumps, poorly shaped bumps, weakly bonded bumps, etc.

Although the invention is illustrated and described herein with reference to specific embodiments, the invention is not intended to be limited to the details shown. Rather, various modifications may be made in the details within the scope and range of equivalents of the claims and without departing from the invention.

What is claimed:
1. A method of forming a wire loop comprising the steps of:
   (1) forming a conductive bump on a bonding location using a wire bonding tool;
   (2) bonding a portion of wire to another bonding location using the wire bonding tool;
   (3) extending a length of wire from the bonded portion of wire toward the bonding location;
   (4) lowering the wire bonding tool toward the bonding location while detecting a height of a tip of the wire bonding tool; and
   (5) interrupting the lowering of the wire bonding tool during step (4) upon the tip of the wire bonding tool reaches a predetermined height, wherein step (1) includes: (a) bonding a free air ball to the bonding location using the wire bonding tool to form a bonded ball; (b) raising the wire bonding tool to a desired height, with a wire clamp open, while paying out wire continuous with the bonded ball; (c) closing the wire clamp; (d) lowering the wire bonding tool to a smoothing height with the wire clamp still closed; (e) smoothing an upper surface of the bonded ball, with the wire clamp still closed, using the wire bonding tool; and (f) raising the wire bonding tool, with the wire clamp still closed, to separate the bonded ball from wire engaged with the wire bonding tool, thereby forming the conductive bump on the bonding location.

2. The method of claim 1 wherein the predetermined height is a bonding height detected during step (1).

3. The method of claim 1 wherein the predetermined height is lower than a bonding height detected during step (1) by an amount equal to a height threshold.

4. The method of claim 3 wherein the height threshold is less than 10 micrometers.

5. The method of claim 1 wherein the predetermined height is a smoothing height used for smoothing the conductive bump formed during step (1), the smoothing height being detected during step (1).

6. The method of claim 1 wherein the predetermined height is lower than a smoothing height used for smoothing the conductive bump formed during step (1) by an amount equal to a height threshold, the smoothing height being detected during step (1).

7. The method of claim 6 wherein the height threshold is less than 10 micrometers.

8. The method of claim 1 wherein step (3) includes extending the length of wire from the bonded portion such that the length of wire is continuous with the bonded portion.

9. The method of claim 1 wherein step (b) includes raising the wire bonding tool to the desired height, the desired height being a tail height of a bumping process.

10. A method of detecting if a conductive bump is in a desired position in connection with formation of a stand-off stitch bond wire loop, the method comprising the steps of:
  (1) forming a conductive bump on a bonding location using a wire bonding tool, the conductive bump being configured to be a stand-off for a stand-off stitch bond wire loop;
  (2) bonding a portion of wire to another bonding location using the wire bonding tool;
  (3) extending a length of wire from the bonded portion of wire toward the bonding location;
  (4) lowering the wire bonding tool toward the bonding location while detecting a height of a tip of the wire bonding tool; and
  (5) interrupting the lowering of the wire bonding tool during step (4) upon the wire bonding tool reaches a predetermined height, wherein step (1) includes: (a) bonding a free air ball to the bonding location using the wire bonding tool to form a bonded ball; (b) raising the wire bonding tool to a desired height, with a wire clamp open, while paying out wire continuous with the bonded ball; (c) closing the wire clamp; (d) lowering the wire bonding tool to a smoothing height with the wire clamp still closed; (e) smoothing an upper surface of the bonded ball, with the wire clamp still closed, using the wire bonding tool; and (f) raising the wire bonding tool, with the wire clamp still closed, to separate the bonded ball from wire engaged with the wire bonding tool, thereby forming the conductive bump on the bonding location.

11. The method of claim 10 wherein the predetermined height is a bonding height detected during step (1).

12. The method of claim 10 wherein the predetermined height is lower than a bonding height detected during step (1) by an amount equal to a height threshold.

13. The method of claim 12 wherein the predetermined threshold is less than 10 micrometers.

14. The method of claim 10 wherein the predetermined height is a smoothing height used for smoothing the conductive bump formed during step (1), the smoothing height being detected during step (1).

15. The method of claim 10 wherein the predetermined height is lower than a smoothing height used for smoothing the conductive bump formed during step (1) by an amount equal to a height threshold, the smoothing height being detected during step (1).

16. The method of claim 15 wherein the height threshold is less than 10 micrometers.

17. The method of claim 10 wherein step (3) includes extending the length of wire from the bonded portion such that the length of wire is continuous with the bonded portion.

18. The method of claim 10 wherein step (b) includes raising the wire bonding tool to the desired height, the desired height being a wire tail height of a bumping process.

* * * * *